(12) United States Patent
Vladimirova et al.

(10) Patent No.: US 11,887,910 B2
(45) Date of Patent: Jan. 30, 2024

(54) ELECTRONIC POWER MODULE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Kremena Vladimirova, Grenoble (FR); Jean-Christophe Crebier, Bevenais (FR); Julie Widiez, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 179 days.

(21) Appl. No.: 17/272,843

(22) PCT Filed: Sep. 2, 2019

(86) PCT No.: PCT/FR2019/052014
§ 371 (c)(1),
(2) Date: Mar. 2, 2021

(87) PCT Pub. No.: WO2020/049245
PCT Pub. Date: Mar. 12, 2020

(65) Prior Publication Data
US 2021/0351100 A1 Nov. 11, 2021

(30) Foreign Application Priority Data
Sep. 4, 2018 (FR) ...................... 18 57934

(51) Int. Cl.
H01L 23/00 (2006.01)
H01L 23/373 (2006.01)
H01L 23/492 (2006.01)

(52) U.S. Cl.
CPC ........ *H01L 23/3735* (2013.01); *H01L 23/492* (2013.01); *H01L 24/08* (2013.01);
(Continued)

(58) Field of Classification Search
CPC ......... H01L 2224/05647; H01L 23/492; H01L 23/3735
See application file for complete search history.

(56) References Cited

U.S. PATENT DOCUMENTS

2007/0075413 A1* 4/2007 Egawa ................ H01L 21/6835
257/E21.705
2010/0230800 A1* 9/2010 Beaupre ................ H01L 23/473
257/691
2011/0062600 A1 3/2011 Ueno et al.
2017/0338208 A1 11/2017 Letowski et al.

FOREIGN PATENT DOCUMENTS

EP 2 244 288 A1 10/2010
FR 3 028 095 A1 5/2016
(Continued)

OTHER PUBLICATIONS

Benaissa, L. et al. "A Vertical Power Device Conductive Assembly at Wafer Level using Direct Bonding Technology," 24$^{th}$ International Symposium on Power Semiconductor Devices and ICs (ISPSD), IEEE, Jun. 3, 2012, pp. 77-80.
(Continued)

*Primary Examiner* — Hoa B Trinh
(74) *Attorney, Agent, or Firm* — Oblon, McClelland, Maier & Neustadt, L.L.P.

(57) ABSTRACT

An electronic power module includes at least a semiconductor chip having at least one electronic power component
(Continued)

and two metal layers between which the semiconductor chip is directly secured. At least a first of the two metal layers forms a redistribution layer having several distinct metal portions, each electrically connected to at least one electrical contact pad of the semiconductor chip, and/or at least one second of the two metal layers includes at least one first structured face arranged against the semiconductor chip and having at least one pad formed in a part of its thickness.

14 Claims, 2 Drawing Sheets

(52) U.S. Cl.
CPC ............... *H01L 2224/05647* (2013.01); *H01L 2224/80895* (2013.01)

(56) References Cited

FOREIGN PATENT DOCUMENTS

| JP | 2005-150596 A | 6/2005 |
| JP | 2010-239033 A | 10/2010 |
| JP | 2011-138851 A | 7/2011 |
| JP | 2013-58645 A | 3/2013 |

OTHER PUBLICATIONS

French Search Report (with English translation of categories) dated Jul. 8, 2019 in French Application No. 18 57934 filed on Sep. 4, 2018, 2 pages.
International Search Report dated Mar. 16, 2020 in PCT/FR2019/052014 filed on Sep. 2, 2019, 4 pages.

\* cited by examiner

ELECTRONIC POWER MODULE

TECHNICAL FIELD AND PRIOR ART

The invention relates to the field of power electronics, and in particular the field of packaging power semiconductor chips and power electronic modules.

In the field of power electronics, the power electronic modules, or devices, offered must ideally meet a plurality of constraints: low cost, small size, high power density, efficacy and reliability. More and more severe use constraints (high voltage, high frequency, high temperature) have led the scientific community to look into the use of novel materials such as GaN, SiC and diamond. These wide-bandgap materials make it possible to push back the current limits of power electronic components (diodes, transistors, thyristors) made from silicon.

In a power electronic module that includes one or more of these components, packaging adapted to this type of component is necessary to fully profit from their performance since the characteristics of the packaging have a great influence on the electrical and thermal behaviour as well as the reliability of the power electronic module.

The packaging, also referred to as a package, of a power electronic module, designates the casing in which one or more semiconductor chips (which each include one or more power electronic components) are disposed, and which comprises all the elements fulfilling the functions of internal and external electrical insulation, of electrical connection between the component or components and the external circuit, of thermal connection in order to allow discharge of the heat produced by the component or components in operation, of mechanical strength and of physical protection of the semiconductor chip or chips.

The packages most used in power electronics are 2D packages, also referred to as planar packages. In a 2D package, the rear face or faces of the semiconductor chip or chips are transferred by soldering or sintering onto a substrate, or metallised support formed by a stack of a plurality of layers of different materials (conductive and dielectric), such as for example a DBC (direct bonded copper) substrate. The substrate provides the electrical connections and the mechanical strength of the semiconductor chip or chips transferred onto the substrate and provides the means for connection with the cooling system. The electrical connection on the front face of power electronic chips is provided by means of bonding wires or connection strips. Finally, a cap covers the substrate as well as the semiconductor chip or chips. Lyre-shaped connectors or a lead frame (also called a conductive frame) interconnect the potentials inside the module with the outside of the package.

Such a 2D package has several drawbacks:
  cooling of the semiconductor chip or chips is provided only from one face (the rear face) of the semiconductor chip or chips because of the presence of the bond wires or connection strips on the front face of this semiconductor chip or chips;
  the bond wires, the connection strips, the lyre-shaped connectors and the lead frame cause stray wiring inductances that limit the performance of a power electronic module formed with such a package;
  from an electromagnetic point of view, since all the electrical contacts of the substrate connected to the semiconductor chip or chips are present on the front face of the substrate, common-mode conducted-disturbance paths (from the circuit to earth) are generated by means of stray capacitances formed between these electrical contacts of the substrate and the base of the substrate, generally connected to earth;
  this type of assembly includes a plurality of materials (Cu, Al, Si, ceramics, solders) close to each other, which have different CTEs (coefficients of thermal expansion). During the various thermal cycles applied to the module, it therefore undergoes high deformations limiting its service life, such as for example: detachment of the copper from the DBC substrate, cracking of the ceramic of the substrate, detachment and cracking of the bond wires, delamination or cracking of the solder (usually in the corners since the mechanical stresses are the greatest there, because the semiconductor chips are generally cut in the form of rectangles (or squares) and the surface of the solder corresponds to the surface of the chips).

Thus, notwithstanding the good technical maturity of 2D packaging, these electrical, electromagnetic, thermal and thermomechanical limits encourage the development of other packaging approaches aimed at improving the performance of power electronic modules.

Another type of packaging, referred to as 3D packaging, proposes to produce the same stack of solder, substrate and cooling system as the one used for 2D packages, but distributed over both faces of the semiconductor chips. In order to make such an assembly possible, a plurality of families of interconnections on the front face have been developed in order to replace the bonding wires: pressed, soldered or spring contacts, bumps, or copper clips. Such a packaging provides benefits in terms of thermal performance and electromagnetic compatibility. Nevertheless, such packaging requires the addition of material of the solder type against the semiconductor chips and additional treatment of the surface of the semiconductor chips in order to adapt them to this type of contacting, which reduces the thermomechanical performance of the module. In addition, such packaging is adapted to be implemented on the chip scale, that is to say implemented in a unitary fashion for each chip, and implementing a collective assembly method implemented simultaneously for a plurality of semiconductor chips is difficult with such packaging. Finally, this packaging does not provide a solution to the low thermomechanical reliability of power electronic modules related to the sensitivity thereof to thermal cycles because of the difference in CTE of the various materials that constitute the power electronic module and the increasing number of stacked layers for implementing the interconnections.

DESCRIPTION OF THE INVENTION

One aim of the present invention is to propose packaging improving at least some of the electromagnetic, thermal, electrical and thermomechanical properties of a power electronic module compared with the packagings of the prior art previously described.

For this purpose, the present invention relates to a power electronic module including at least:
  one semiconductor chip comprising at least one power electronic component;
  two metal layers between which the semiconductor chip is directly secured, and such that at least a first of the two metal layers forms a redistribution layer comprising a plurality of distinct metal portions each electrically connected to at least one electrical contact pad of the semiconductor chip; and/or such that at least a second of the two metal layers includes at least one structured first face disposed against the semiconductor chip and comprising at least one pad formed in a part of the thickness thereof.

The semiconductor chip is disposed and directly secured between the two metal layers; without any addition of supplementary material between the semiconductor chip and each of the two metal layers by a direct bonding method (assisted or not by thermocompression). This makes it possible to make more robust the electrical connections of this chip, as well as the electrical interconnections between the power electronic components when the semiconductor chip includes a plurality of power electronic components and/or when the power electronic module includes a plurality of semiconductor chips directly secured to the two metal layers.

The surface metallisation of the semiconductor chip is of the same nature as that of the metal or metals forming the two metal layers.

The direct securing between the metal layers and the semiconductor chip also helps to improve the electromagnetic behaviour of the power electronic module since the electrical connections connected to the semiconductor chip are no longer implemented by bond wires or connection strips, which avoids causing stray wiring inductances.

The thermal and thermomechanical behaviour of the power electronic module is also improved by means of the fact that no solder material is present between each of the two metal layers and the semiconductor chip. The absence of solder in contact with the semiconductor chip makes it possible to avoid failures of the chip due to this solder, in particular when the semiconductor chip is subjected to high temperature variations.

The two metal layers may be formed from 3D-structured solid metal plates.

The 3D structuring of the metal layers makes it possible to avoid having to implement a step of electrochemical deposition, or ECD, to form the surface redistribution layer of the semiconductor chip, which simplifies the implementation of the structure and also makes it possible to easily produce redistribution patterns that are different from one chip to another when a plurality of power electronic modules is produced collectively from two metal plates used for producing the two metal layers of each of the power electronic modules.

In addition, the connection elements formed by the metal portions of the first of the two metal layers are able to pass currents much higher than those that can pass through interconnections formed conventionally by ECD in the context of redistribution layers. The metal portions of the redistribution layer can form contacts and interconnections with high current ratings and which can be transferred as close as possible to the power electronic component or components of the module. The forms of the metal portions of the redistribution layer can be completely controlled, which makes the EMC (electromagnetic compatibility) behaviour conducted and radiated from this redistribution layer completely optimum by reducing to the maximum the capacitive effects (for example by virtue of the absence of any making of contact on a metallised support such as a DBC substrate for interconnecting the midpoints of cells formed by the power electronic components) and magnetic effects, the metal portions being able to form short conductive tracks close to the semiconductor chip or chips, thus reducing the sizes of the switching meshes and avoiding loops with contact made on the metallised support.

The first of the two metal layers may implement both the distribution and the interconnection of the electrical contact pads of the semiconductor chip, in a single level.

The semiconductor chip and the two metal layers between which the semiconductor chip is disposed form an assembly the structure of which is symmetrical. This symmetry makes it possible to not create any deformation when the two metal layers are secured against the semiconductor chip.

The metal layers disposed on each side of the semiconductor chip make it possible to envisage novel configurations in the design of the module, because of the degrees of freedom given by the possibility of structuring the metal layers.

Furthermore, the structured face of the second of the two metal layers that includes the pad or pads disposed against one of the faces of the semiconductor chip, for example against the front face of the semiconductor chip, helps to improve the thermal and thermomechanical behaviour of the module, in particular via the possibility of also using this face of the semiconductor chip for cooling thereof.

The first of the two metal layers may form interconnections between a plurality of electronic components of the chip and/or between a plurality of semiconductor chips, and/or form regions for transferring or making contacts with larger dimensions than the electrical contact pads of the semiconductor chip, and/or to form heat exchange surfaces larger than those formed by the semiconductor chip.

The structure of this power electronic module is also compatible with a collective production, that is to say simultaneous to the scale of a wafer including power electronic components, or between two wafers including power electronic components to form 3D switching cells based on the stacking of semiconductor chips on one another.

The semiconductor chip may advantageously include GaN. In this case, the power electronic component or components of this semiconductor chip advantageously have a so-called lateral structure, which signifies that the active region and the electrodes of this or these components are located on a single face (front face) of the component or components. The power current circulates entirely in this very thin region (often with a thickness of less than approximately 10 μm), which involves a high power density and therefore a great need for cooling. The packaging of the power electronic module proposed here is well adapted to such components because the structure thereof is compatible with cooling implemented at the two main faces of the semiconductor chip or chips. Cooling may however be implemented at the two main faces of the semiconductor chip or chips even when the semiconductor chip includes a semiconductor other than GaN.

The GaN-based components have switching dynamics of several hundreds of volts and around ten amperes per nanosecond. The packaging of the power electronic module proposed here leads to an optimised conducted and radiated EMC behaviour adapted to such constraints.

At least the first of the two metal layers may provide the interconnection of the power electronic components to the scale of the substrate from which these components are produced, or to the scale of a block of components, distributed in one or more semiconductor chips. Thus, in addition to the electromagnetic and thermal advantages provided by the two metal layers, this configuration optimises the system integration of the lateral components.

The use of a thick metal layer to form the redistribution layer makes it possible to reinforce/enlarge the accommodating areas and the contacts of each power electrode of the component or components. This contact, by adding material, provides an optimum connection between the last metal level on the component side and the making of contact between the components and their environment.

The pad or pads formed by the structured face of the second metal layer provide not only the mechanical strength of the module but also make it possible to release the stresses caused by the difference in CTE between the semiconductor of the chip and a substrate, for example of the DBC type, on which the second of the two metal layers can be disposed. It is possible to produce the pads with a density, a height and a radius of curvature of greater or lesser magnitude in order to optimise the distribution of the stresses caused by the difference in CTE and by the flow of heat to which the chip may be exposed.

The first structured face of the second of the two metal layers disposed against the semiconductor strip may form, in only part of the thickness thereof, at least two separate pads disposed against the semiconductor face.

In an advantageous embodiment, the first and/or the second of the two metal layers may have a thickness greater than approximately 100 µm and/or may include copper. Such a thickness cannot, at reasonable cost, be obtained by the methods of the ECD type.

The electrical contact pads of the semiconductor chip or chips include one or more metals similar to that or those of at least the first of the two metal layers, for example copper, which facilitates the direct bonding against at least the first of the two metal layers and the semiconductor chip.

The power electronic module may further include a first metallised support to which the second of the two metal layers is secured. The CTE of the first metallised support may be close to or similar to that of the second of the two metal layers. Thus, at the time of this securing, the semiconductor chip is subjected to few thermomechanical stresses. The second of the two metal layers may be secured to the first metallised support, for example by means of a first layer of solder. This first layer of solder is in this case little stressed because of the close or similar CTEs of the materials of the first metallised support and of the second of the two metal layers.

Advantageously, the pad or each of the pads of the first structured face of the second of the two metal layers may include a cross section, in a plane passing through said first structured face, the form of which includes rounded corners or is substantially circular in form. This form of pads makes it possible to reduce the thermomechanical stresses undergone by the semiconductor chip. Other forms of pads are also possible.

A second face, opposite to the structured first face, of the second of the two metal layers may include a rim laterally delimiting a space wherein the first layer of solder is disposed. This rim makes it possible in particular to protect the lateral flanks of the semiconductor chip at the time of the securing between the second of the two metal layers and the first metallised support, which includes for example a DBC substrate, avoiding an overflow of the solder coming from this first layer of solder.

One or each of the two metal layers may include a central layer comprising at least one first metal and which is covered with another layer of at least one second metal different from the first metal and against which the semiconductor chip is secured. Thus, the first metal may be selected for some properties, for example thermal (the material of the central layer may for example be selected such that it favours the transport of heat and current), although it is not for example adapted to be secured directly to the semiconductor chip, this direct bonding being provided by the second metal. In this configuration, one or each of the two metal layers may be formed by a plurality of superimposed metals, obtained for example by lamination, which makes it possible for example to select, for the material against which the semiconductor chip is engaged, a CTE adapted to that of the materials of the semiconductor chip, thus contributing to the adaptation of the CTEs of the various elements of the module.

The first of the two metal layers may include a second face, opposite to a first face disposed against the semiconductor chip, secured at least to a second metallised substrate and/or to lyre-shaped power connectors and/or to a decoupling capacitor and/or to a control electronic device.

The second metallised substrate may thus serve to implement dual-face cooling of the semiconductor chip.

The lyre-shaped power connectors thus disposed make it possible to avoid any taking up of contact from a metallised support such as a DBC substrate and eliminate the current loops formed in the modules of the prior art that include bond wires or connection strips. It is therefore possible that no floating potential is transferred onto the DBC substrate, which limits stray propagation paths of the capacitive type formed in the power electronic module.

The first of the two metal layers may include a structured first face disposed against the semiconductor chip and comprising pads formed in a part of the thickness thereof.

The power electronic module may include at least one second semiconductor chip comprising at least one second power electronic component and disposed directly between the two metal layers. In this case, the power electronic module forms a power electronic module comprising a plurality of semiconductor chips secured directly to the two metal layers.

The invention also relates to a method for producing at least one power electronic module, including at least the implementation of the following steps:
  producing, from at least a first of two metal layers, a redistribution layer comprising a plurality of distinct metal portions, and/or structuring at least a first face of a second of the two metal layers, forming pads in a part of the thickness thereof;
  securing, by direct bonding, a semiconductor chip comprising at least one power electronic component between the two metal layers, so that each of the metal portions of the first of the two metal layers is electrically connected to at least one electrical contact pad of the semiconductor chip and/or so that the first structured face of the second of the two metal layers is disposed against the semiconductor chip.

The securing, by direct bonding, of the semiconductor chip between the two metal layers may include the implementation of a thermocompression of the two metal layers against the semiconductor chip. Such thermocompression may or may not be implemented according to the surface states of the semiconductor chip and of the two metal layers.

The method may further include the implementation of a step of securing, by means of a first layer of solder, between the second of the two metal layers of the power electronic module and a first metallised support, such as for example a substrate of the DBC type. Such securing to another metallised support may also be implemented at the first of the two metal layers of the power electronic module.

The securing, by direct bonding, of the semiconductor chip between the two metal layers may correspond to a securing by direct bonding of a first substrate forming a matrix of semiconductor chips between two second metal substrates intended each to form one of the two metal layers.

In this case, the production method is advantageously implemented to the scale of the substrate, or wafer, which includes the power electronic components, in order to simultaneously produce a plurality of power electronic modules and in particular to simultaneously produce all the interconnections between a plurality of power electronic components produced in a matrix, from the same semiconductor substrate. Such a collective implementation makes it possible to make the production of the power electronic modules more reliable. In this configuration, three wafers or substrates are assembled in order to form symmetrical stacks. The substrates used are of two types: semiconductor substrate containing a matrix of unitary or monolithic power components (matrix of chips each comprising one or more power electronic components) and metal substrates structured to form the metal layers to which the chips will be connected. The two types of substrate are designed to be assembled suitably, without the addition of material with a thermocompression bonding method. The surface states of the substrates and the respective positions of the contacts are designed and implemented suitably (with respect to the contacts, sizes and positions of the contacts, and the surface state and materials of the contacts).

The method may further include, after the securing step, the implementation of a step of cutting the first and second substrates, forming a plurality of power electronic modules each including at least one of the semiconductor chips secured directly to the two metal layers.

BRIEF DESCRIPTION OF THE DRAWINGS

The present invention will be understood better from reading the description of example embodiments given purely by way of indication and in no way limitatively, referring to the accompanying drawings, wherein.

Identical, similar or equivalent parts of the various figures described below bear the same numerical references so as to facilitate passing from one figure to another.

The various parts shown in the figures are not necessarily shown to a uniform scale, in order to make the figures more legible.

The various possibilities (variants and embodiments) must be understood as not being mutually exclusive and may be combined with each other.

DETAILED DESCRIPTION OF PARTICULAR EMBODIMENTS

Figure 1:
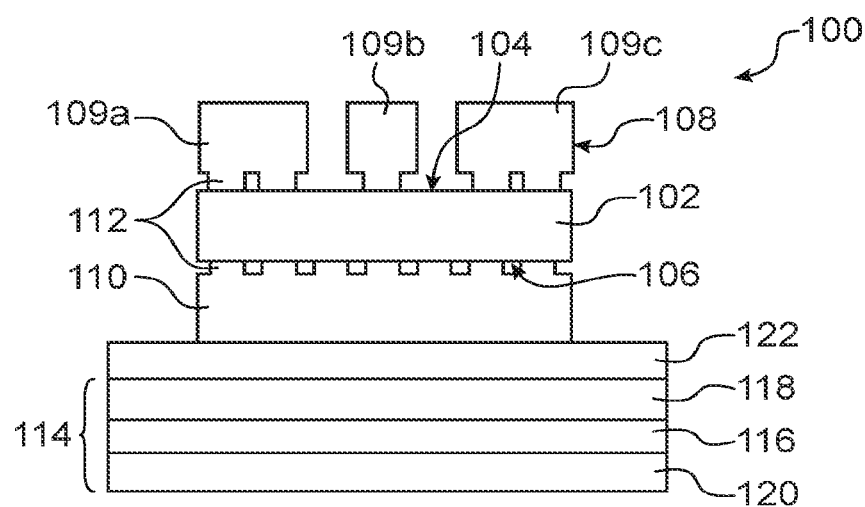
FIG. 1 shows a power electronic module that is the object of the present invention, according to a first embodiment.

Reference is made first of all to FIG. 1, which shows a power electronic module 100, or power electronic module, according to a first embodiment.

The module 100 includes a semiconductor chip 102 wherein one or more power electronic components are formed. This power electronic component or components correspond for example to diodes, transistors or thyristors. The chip 102 includes first and second main faces respectively referenced 104 and 106. The chip 102 also includes electrical contact pads present on the first main face 104 and/or on the second main face 106 (on both these main faces if the power electronic component or components each have a vertical structure). The electrical contact pads of the chip 102 are connected to active regions of the power electronic component or components of the chip 102. These electrical contact pads of the chip 102 include for example copper, AlCu or titanium or any other metal material.

The module 100 also includes first and second metal layers 108, 110 each directly secured to one of the first and second main faces 104, 106 of the chip 102, i.e. without any intermediate material for implementing the bonding step (in particular solder) interposed between the metal layers 108, 110 and the faces 104, 106 of the chip 102. The thickness of each of the metal layers 108, 110 is for example greater than approximately 100 µm, and for example equal to several hundreds of microns. The metal layers 108, 110 advantageously include copper.

At least one of the two metal layers 108, 110 forms a redistribution layer, that is to say which is structured so that it forms a plurality of distinct metal portions electrically connected to the electrical contact pads of the chip 102.

According to a first configuration, the electrical contact pads of the chip 102 may be disposed on only one of the two faces 104, 106. This is the case with the example embodiment shown in FIG. 1, where all the electrical contact pads of the chip 102 are disposed on the main face 104. In this case, only one of the two metal layers 108, 110 forms a redistribution layer connected to these electrical contact pads (the first layer 108 on the example embodiment shown in FIG. 1). According to a second configuration, the electrical contact pads of the chip 102 may be disposed on the two faces 104, 106. In this case, the two layers 108, 110 form redistribution layers connected to these electrical contact pads.

The metal layer or layers serving as redistribution layers may be structured to form distinct metal portions each connected to one or more of the electrical contact pads of the chip 102. On the example embodiment shown in FIG. 1, the layer 108, serving as a redistribution layer, is structured so as to form a plurality of distinct portions each connected to one or more electrical contact pads of the chip 102 distinct from the other pad or pads to which the other portions of the layer 108 are connected. On the example in FIG. 1, three distinct portions 109a, 109b and 109c of the layer 108 are shown. In order to form these portions 109 distinct from each other, the first metal layer 108 is structured, for example etched, over the entire thickness thereof. Trenches separating these various portions 109 pass through the entire thickness of the layer 108.

In addition, in the first embodiment described here, the face of each of the metal layers 108, 110 that is located on the same side as the chip 102 is also structured so as to form pads 112 in contact with the chip 102. These pads 112 are formed in a part of the thickness of the metal layers 108, 110.

Figure 2A:
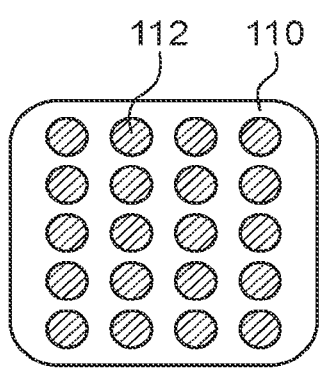
FIGS. 2A and 2B show an example embodiment of pads formed on the surface of one of the two metal layers of a power electronic module that is the object of the present invention.

FIG. 2A shows a first example embodiment of the pads 112. This figure shows a plan view of the second metal layer 110, the top face of this layer 110 being structured by forming pads in part of the thickness of the layer 110. On this example, each of the pads 112 comprises a cross section, in a plane passing through this top face of the layer 110, with a substantially circular shape. On this FIG. 2A, hatchings represent the surfaces of the pads in contact with the chip 102.

Figure 2B:
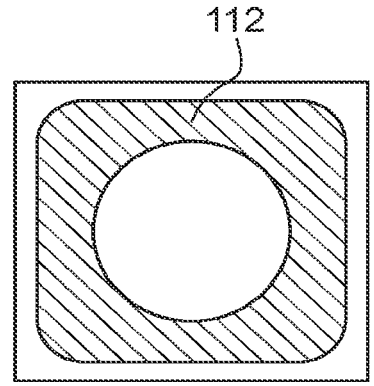

FIG. 2B shows another variant embodiment with a single solid pad 112 on the layer 110. There also, hatchings represent the surface of the pad 112 in contact with the chip 102. According to a variant embodiment, the pads 112 may have a cross section the form of which includes rounded corners with a radius of curvature that may vary, which makes it possible to optimise the mechanical stresses due to the corners.

The assembly formed by the chip 102 and the metal layers 108, 110 is transferred onto the front face of a metallised support 114 corresponding here to a DBC substrate formed by a dielectric central layer 116, comprising for example a ceramic, disposed between a top metal layer 118 and a bottom metal layer 120, for example comprising on copper. The securing between this assembly and the metallised support 114, and more precisely between the metal layer 110 and the top metal layer 118, is provided by a layer of solder 122.

Although not visible in FIG. 1, the metallised support 114 may be secured, at the rear face thereof and by means of another layer of solder, to a cooling assembly comprising for example a metal sole plate, or "spreader" according to English terminology, and a heat dissipater connected to each other by a thermal grease.

Figure 3:
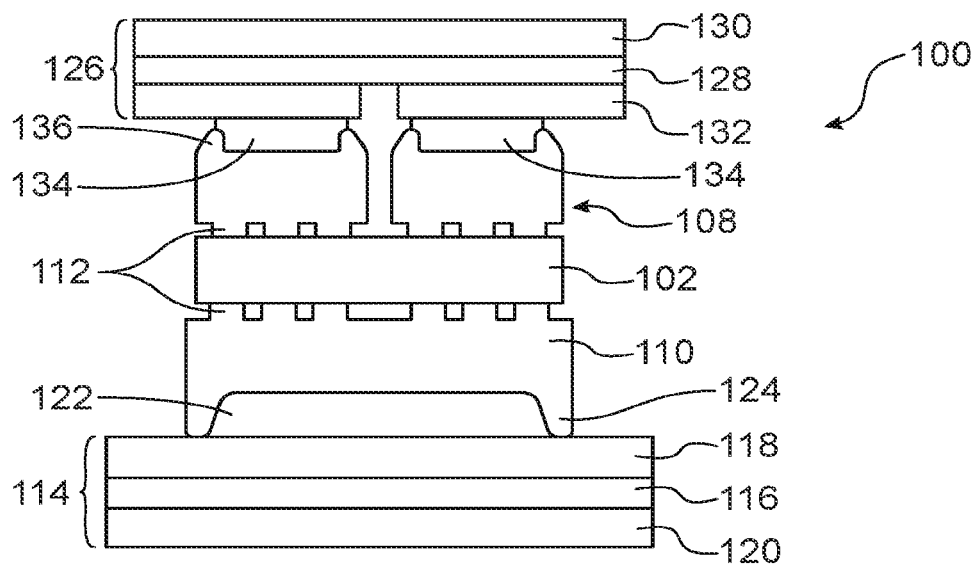
FIG. 3 shows a power electronic module that is the object of the present invention, according to a second embodiment.

The power electronic module 100 according to a second embodiment is shown in FIG. 3.

Figure 4:
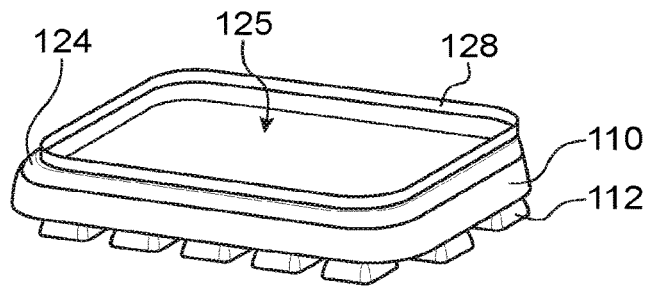
FIG. 4 shows an example embodiment of one of the two metal layers of the power electronic module that is the object of the present invention, according to a second embodiment.

In this second embodiment, the second metal layer 110 includes, at the rear face thereof (the one located on the same side as the metallised support 114) a rim 124 laterally delimiting a space 125 (visible in FIG. 4) wherein the layer of solder 122 is disposed. FIG. 4 shows in more detail the second metal layer 110. The rim 124 is covered with a dielectric material 128 for containing the solder of the layer 122 through its low wettability by the solder. This dielectric material 128 is for example an oxide or a varnish. In this configuration, the risk that the solder material may interfere with the correct functioning of the chip 102 after the second metal layer 110 is secured to the metallised support 114 is avoided.

Furthermore, in this second embodiment, a second metallised substrate 126 is secured to the rear face (the one located on the side opposite to the chip 102) of the first metal layer 108. This second metallised substrate 126 corresponds for example to a DBC substrate formed, like the first metallised substrate 114, from a dielectric central layer 128 disposed between two metal layers 130 and 132. The securing between the rear face of the first metal layer 108 and the metallised support 126, and more precisely between the metal layers 108 and 132, is provided by a layer of solder 134. In the example embodiment described here, the metal layer 108 (or more precisely one or more of the various metal portions formed by the layer 108) includes, at the rear face thereof, a rim 136 laterally delimiting a space wherein the layer of solder 134 is disposed, in a similar manner to the metal layer 110. In this example embodiment, the cooling of the electronic chip may be implemented in dual face by securing a cooling system (not visible in the figure) to the two metallised supports 114 and 126.

Figure 5:
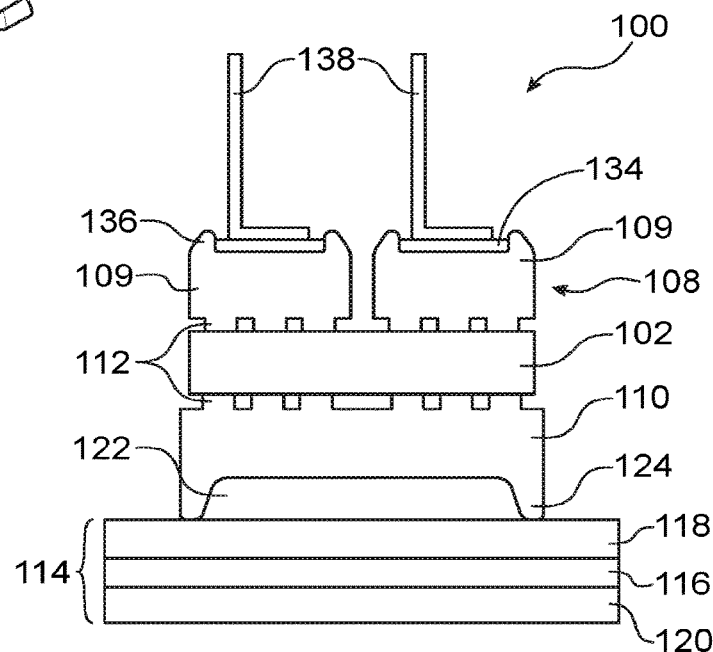
FIG. 5 shows a power electronic module that is the object of the present invention, according to a third embodiment.

The power electronic module 100 according to a third embodiment is shown in FIG. 5.

Compared with the second embodiment previously described, the rear face of the first metal layer 108 is not secured to a second metallised substrate, but to lyre-shaped connectors 138, at some of the distinct portions 109 of the metal layer 108. The securing between the lyre-shaped connectors 138 and the rear faces of the portions 109 of the metal layer 108 is provided by the layer of solder 134, here separated into a plurality of distinct portions on the various portions of the metal layer 108 in order to ensure the securing of each of the lyre-shaped connectors 138.

Figure 6:
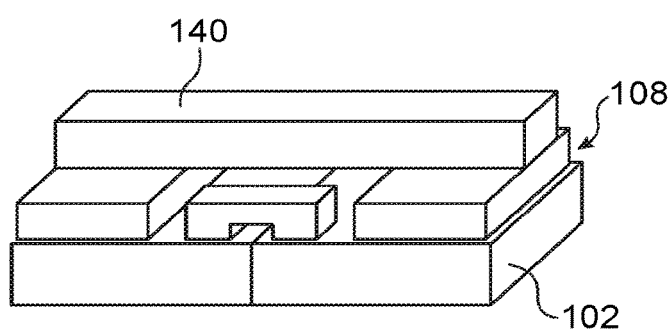
FIGS. 6 and 7 show two variant embodiments of the power electronic module that is the object of the present invention.

According to another variant embodiment shown in FIG. 6, the rear face of the first metal layer 108 may serve as a support for a decoupling capacitor 140 electrically connected to the power electronic component or components of the chip 102 by means of the first metal layer 108.

Figure 7:
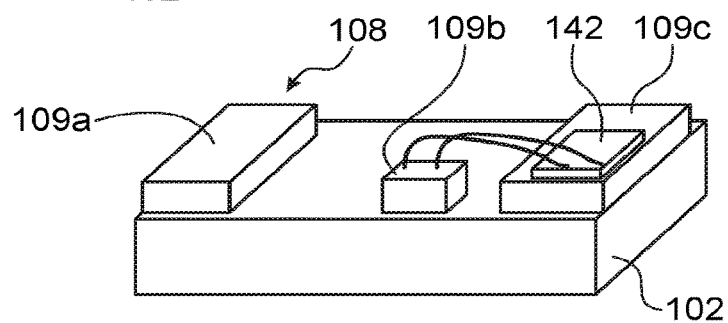

According to another variant embodiment shown in FIG. 7, the rear face of the first metal layer 108 may serve as a support for a control circuit 142, or driver, electrically connected to the power electronic component or components of the chip 102 by means of the first metal layer 108. Such a control circuit 142 can for example serve to control the switching of a power transistor formed in the chip 102. On the example in FIG. 7, the portions 109a, 109b and 109c formed by the first metal layer 108 are connected respectively to the drain, to the gate and to the source of a power transistor formed in the chip 102, the control circuit 142 being disposed on the metal portion 109c connected to the source of the power transistor and electrically connected to the metal portion 109b that is connected to the gate of the power transistor in order to control the switching to the on or off state of the transistor.

In all the embodiments described here, the power electronic component or components of the semiconductor chip 102 may form at least one switching cell. The power electronic module 100 may in particular form a power electronic module comprising a plurality of semiconductor chips 102 forming a plurality of switching cells electrically connected to each other by the two metal layers 108, 110.

An example of a method for producing the power electronic module 100 is described below. In the example described here, the method is implemented so that a plurality of power electronic modules 100 are produced collectively.

Power electronic components are first of all produced from a first semiconductor substrate. The contact pads of these components are produced from copper.

A structuring of two metal substrates is next implemented. This structuring corresponds in particular to the production of perforations passing right through the substrate or substrates intended to form the redistribution layers of the modules 100, and the production of pads on one or both faces of one or both substrates, in a part of the thickness of this or these substrates. Preferably, these metal substrates include copper, which is a metal that is advantageous for both the electrical conductivity thereof and the thermal conductivity thereof. In a variant, one or both metal substrates may include a central layer comprising another metal (for example tungsten or molybdenum, optionally covered with a metal layer more adapted to the implementation of direct bonding with the semiconductor chips produced in the first substrate.

Such metal wafers may be produced by rolling, trimming, structuring by etching (optionally followed by polishing) and right-through etching in order to form the various distinct metal portions.

Direct bonding is next implemented in order to assemble the three substrates by direct bonding. The semiconductor substrate is disposed between the two metal substrates. When the roughness of the bonded surfaces is less than or equal to approximately 0.5 nm RMS, the direct bonding can be implemented at ambient temperature without applying any pressure between the bonded elements. When the roughness of the bonded surfaces is higher than this value, for example between approximately 0.5 nm RMS and 100 nm RMS, a thermocompression (pressure for example of a few MPa and temperature controlled for example at between [300-400]° C. during the bonding) may be implemented during the bonding.

The assembly obtained after this bonding is next completely passivated, for example by injecting a passivation material into the assembly.

The assembly produced is next diced in order to produce the various individual power electronic modules 100.

In a variant, the passivation may be implemented after this cutting step, each module 100 being passivated individually.

The metal layers 108, 110 are next secured to the other elements provided: metallised support 114, 126, lyre-shaped connectors 138, etc.

The invention claimed is:

1. A power electronic module including:
   at least one semiconductor chip comprising at least one power electronic component;
   at least two metal layers between which the at least one semiconductor chip is directly secured, wherein at least a first of the at least two metal layers includes at least one first structured face disposed against the at least one semiconductor chip and comprising at least one pad formed in part of a thickness thereof; and
   a first metallised support to which the at least the first of the at least two metal layers is secured by a first layer of solder.

2. The power electronic module according to claim 1, wherein at least a second of the at least two metal layers forms a redistribution layer comprising a plurality of distinct metal portions each electrically connected to at least one electrical contact pad of the at least one semiconductor chip.

3. The power electronic module according to claim 2, wherein the second of the at least two metal layers has a thickness greater than approximately 100 μm and/or includes copper.

4. The power electronic module according to claim 2, wherein the second of the at least two metal layers includes a central layer comprising at least a first metal and covered with another layer of at least a second metal different from the first metal and against which said at least one semiconductor chip is secured.

5. The power electronic module according to claim 2, wherein the first of the at least two metal layers includes a second face, opposite to a first face disposed against the at least one semiconductor chip, secured at least to one of the following elements:
   a second metallised substrate,
   a power contact,
   a decoupling capacitor, and
   an electronic control device.

6. The power electronic module according to claim 2, wherein the second of the at least two metal layers includes a first structured face disposed against the semiconductor chip and comprising pads formed in a part of a thickness thereof.

7. The power electronic module according to claim 1, wherein a second face, opposite to the first structured face, of the first of the at least two metal layers includes a rim laterally delimiting a space wherein the first layer of solder is disposed.

8. The power electronic module according to claim 1, wherein the at least one pad of the first structured face of the first of the at least two metal layers includes a cross section, in a plane passing through the first structured face, a form of which includes rounded corners or is substantially circular.

9. The power electronic module according to claim 1, wherein the first of the at least two metal layers at least one of:
   has a thickness greater than approximately 100 μm, and includes copper.

10. The power electronic module according to claim 1, wherein the first of the at least two metal layers includes a central layer comprising at least a first metal and covered with another layer of at least a second metal different from the first metal and against which the at least one semiconductor chip is secured.

11. The power electronic module according to claim 1, including at least one second semiconductor chip comprising at least one second power electronic component and disposed directly between said at least two metal layers.

12. A power electronic module including:
    at least one semiconductor chip comprising at least one power electronic component; and
    at least two metal layers between which said at least one semiconductor chip is directly secured, wherein at least a first of said at least two metal layers forms a redistribution layer comprising a plurality of distinct metal portions each electrically connected to at least one electrical contact pad of said at least one semiconductor chip.

13. The power electronic module according to claim 12, wherein the first of the at least two metal layers includes a central layer comprising at least a first metal and covered with another layer of at least a second metal different from the first metal and against which the at least one semiconductor chip is secured.

14. The power electronic module according to claim 12, wherein the first of the at least two metal layers includes a first structured face disposed against the semiconductor chip and comprising pads formed in a part of a thickness thereof.

* * * * *